United States Patent
Oda et al.

(10) Patent No.: US 6,670,051 B2
(45) Date of Patent: *Dec. 30, 2003

(54) ORGANIC ELECTROLUMINESCENT DEVICE USING HOLE-INJECTABLE, LIGHT-EMITTING MATERIAL

(75) Inventors: Atsushi Oda, Tokyo (JP); Hitoshi Ishikawa, Tokyo (JP); Satoru Toguchi, Tokyo (JP); Yukiko Morioka, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/425,052

(22) Filed: Oct. 22, 1999

(65) Prior Publication Data

US 2002/0160225 A1 Oct. 31, 2002

(30) Foreign Application Priority Data

Oct. 23, 1998 (JP) ............................................. 10-302547

(51) Int. Cl.[7] ............................................... H05B 33/14
(52) U.S. Cl. ....................... 428/690; 428/917; 313/504; 313/506
(58) Field of Search ................................. 428/690, 704, 428/917; 313/504, 506

(56) References Cited

U.S. PATENT DOCUMENTS 6,476,550 B1 * 11/2002 Oda et al. .................... 313/504

FOREIGN PATENT DOCUMENTS

| JP | 3-200289 | 9/1991 |
|----|----------|--------|
| JP | 7-138561 | 5/1995 |
| JP | 8-20771 | 1/1996 |
| JP | 8-40995 | 2/1996 |
| JP | 8-40997 | 2/1996 |
| JP | 8-53397 | 2/1996 |
| JP | 8-87122 | 4/1996 |
| JP | 8-109373 | 4/1996 |
| JP | 8199162 | 8/1996 |
| JP | 8-239655 | 9/1996 |
| JP | 9-268284 | 10/1997 |
| JP | 10-72581 | 3/1998 |
| JP | 1088120 | 4/1998 |
| JP | 10251633 | 9/1998 |
| JP | 118068 | 1/1999 |
| JP | 200016973 | 1/2000 |

OTHER PUBLICATIONS

English language translation of JP 9–268284 (Oct. 1997).*
C.W. Tang et al., "Organic Electroluminescent Diodes", *Applied Physics Letters*, vol. 51, No. 12, Sep. 1987, pp. 913–915.

* cited by examiner

*Primary Examiner*—Marie Yamnitzky
(74) *Attorney, Agent, or Firm*—Young & Thompson (57) ABSTRACT

An organic EL device with high brightness and long lifetime, which is capable of driving at low voltage, is provided. As the material for constituting the organic EL device, a specific styryl amino group-containing diphenyl aminoarylene represented by the following general formula [1] (wherein $Ar_1$ is a substituted or unsubstituted arylene group having 5–42 carbons, $Ar_2$ to $Ar_5$ each independently represents substituted or unsubstituted $C_6$ to $C_{20}$ aryl groups, at least one of which is a styrylphenyl group represented by the following general formula [2]) is used in a light-emitting zone adjacent to an anode.

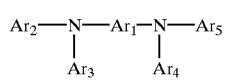

[1]

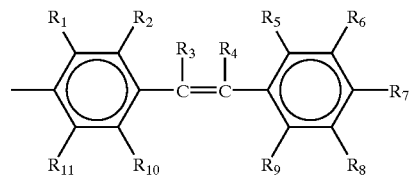

[2]

3 Claims, 1 Drawing Sheet

ORGANIC ELECTROLUMINESCENT DEVICE USING HOLE-INJECTABLE, LIGHT-EMITTING MATERIAL

BACKGROUND OF THE INVENTION

1. Field of the Invention

This invention relates to an organic electroluminescent device using a hole-injectable light-emitting material, excellent in light-emitting properties and particularly in low-voltage driving.

2. Description of the Related Art

An organic electroluminescent device (referred to hereinafter as "organic EL device") is a light-emitting device which makes use of the principle that when an electric filed is applied, a fluorescent material emits light in response to the charge recombination of holes injected from an anode and electrons injected from a cathode. Since C. W. Tang et al. of Eastman Kodak Company reported a low-voltage-driven organic EL device using a double layered structure (C. W. Tang, S. A. VanSlyke, Applied Physics Letters, 51, 913 (1987) and the like), studies on an organic EL device have been briskly carried out. Tang et al. reported an organic EL device using tris(8-hydroxyquinolinol aluminum) in an electron-transporting and light-emitting layer and a triphenyldiamine derivative in a hole injectable layer. This stacked structure gives such advantages as an improvement in the injection efficiency of holes into the light-emitting layer and blocking of electrons injected from a cathode, which increase the efficiency of exciton production from charge recombination. A double layered structure composed of a hole-injecting and transporting layer and an electron-transporting and light-emitting layer or a triple layered structure composed of a hole-injecting and transporting layer, an electron-transporting and light-emitting layer, and an electron-injecting and transporting layer is well known as an organic EL device. In order to increase the recombination efficiency of injected holes and electrons, various improvements in the device structure or fabrication process have been introduced to such multi-layered devices.

As a hole injectable material, triphenylamine derivatives such as 4,4',4"-tris(3-methylphenylphenylamino)triphenylamine and aromatic diamine derivatives such as N,N'-diphenyl-N,N'-bis(3-methylphenyl)-[1,1'-biphenyl]-4,4'-diamine, which are starburst molecules, are well known (e.g., Japanese Patent Application Laid-Open Nos. 20771/1996, 40995/1996, 40997/1996, 53397/1996 and 87122/1996).

As an electron-transporting material, oxadiazole derivatives, triazole derivatives and the like are well known.

As an electron-transporting and light-emitting material, chelate complexes such as tris(8-quinolinolate)aluminum complex are known, and it is also well-known that devices using the mixture of a light-emitting material and a small amount of a fluorescent pigment have an improved efficiency. As these fluorescent pigments, there are known coumarin derivatives, tetraphenylbutadiene derivatives, bis-styrylarylene derivatives, oxadiazole derivatives, porphyrin derivatives, phenoxazoline type pigments, rhodamine type pigments, acridine type pigments and the like. It is reported that various color light in a visible region from blue to red are obtained from these materials, and realization of a full color organic EL device is expected (e.g., Japanese Patent Application Laid-Open Nos. 239655/1996, 138561/1995, 200289/1991 and the like).

However, although the emission efficiency of a triple or more layered organic EL device is high, the driving voltage is increased due to the increase of carrier injection barriers and film thickness as a whole. Further, when the conventional electron-transporting and light-emitting layer is used, there is the disadvantage that the operating voltage is increased due to a high barrier to injection of holes into the light-emitting layer.

In recent days, organic EL devices with high brightness and long lifetime have been disclosed or reported, but these improvements are not enough. There is thus a strong need for development of materials having excellent properties.

SUMMARY OF THE INVENTION

The object of the present invention is to provide an organic EL device with high brightness, long lifetime and low operating voltage, as well as a hole-injectable light-emitting material for constituting this device.

As a result of their eager study to solve the problems described above, the present inventors found that aromatic diamine compounds having specific styrylphenyl groups, shown in the general formulae [1] and [2], or [3] and [4], have high charge-transporting properties caused by the styryl group, and have functions as organic electroluminescent materials when a suitable arylene group between two amino groups is selected. The present inventors also found that the styryl group and the styryl group substituted with a diarylamino group of said aromatic diamine compounds permit holes to be easily injected from indium tin oxide generally used as transparent electrodes or metals such as gold and copper into said aromatic diamine compounds, too. Further, the present inventors found that good EL properties are found in devices having a light-emitting zone constituted of a plurality of layers in which the compounds according to the present invention are used in a layer in contact with the anode and a layer composed of the above-described known light-emitting materials that has been inserted between said layer and the cathode. It was accordingly found that organic EL devices with a light-emitting layer made of the light-emitting materials in contact with the anode emit with higher brightness at lower voltage, and also that their lifetime of emission in the case of continuous driving are longer than in the prior art. Furthermore, the present inventors found that said device using a specific electron-transporting material emits at lower voltage and with higher efficiency because of the preferable balance of injection of holes and electrons into the light-emitting layer. In addition, the wavelength of emission light can be selected by selecting arylene groups for $Ar_1$ in the general formula [1] and for $Ar_6$ in the general formula [3], thus enabling selection of various colors of emission light such as bluish violet, green, yellow, white, orange and red, and the present invention was thereby completed.

An organic electroluminescent device according to the present invention comprises at least an anode, an organic light-emitting zone which consists of one or more than one organic thin-film layers and a cathode as elements, wherein said organic light-emitting zone is adjacent to the anode, and a layer contacting the anode contains, either singly or as a mixture, a compound represented by the following formula [1]:

[1]

wherein $Ar_1$ represents a substituted or unsubstituted arylene group having 5–42 carbons, $Ar_2$ to $Ar_5$ each independently represent a substituted or unsubstituted aryl group having 6–20 carbons, at least one of $Ar_2$ to $Ar_5$ is a styrylphenyl group represented by the following general formula [2], whereupon substituent groups thereof are an alkyl group having 1–6 carbons, an alkoxy group having 1–6 carbons, an aryl group having 6–18 carbons, an aralkyl group having 7–8 carbons, an aryloxy group having 6–18 carbons, a halogen atom, a substituted or unsubstituted amino group (excluding a diarylamino group), a hydroxyl group, a cyano group, and a nitro group.

[2]

wherein $R_1$ to $R_{11}$ each independently represent a hydrogen atom, a halogen atom, a substituted or unsubstituted amino group (excluding a diarylamino group), a hydroxyl group, a cyano group, a nitro group, a alkyl group having 1–6 carbons, an alkoxy group having 1–6 carbons, a substituted or unsubstituted aryl group having 6–18 carbons and a substituted or unsubstituted aryloxy group having 6–18 carbons.

Further, the present invention relates to an organic electroluminescent device wherein a layer contacting with the anode in the light-emitting zone contains, either singly or as a mixture, a compound represented by the following formulae [3] and [4].

[3]

wherein $Ar_6$ represents a substituted or unsubstituted arylene group having 5–42 carbons, $Ar_7$ to $Ar_{10}$ each independently represent substituted or unsubstituted aryl group having 6–20 carbons, at least one and at most three of $Ar_7$ to $Ar_{10}$ are diarylamino-substituted styrylphenyl groups represented by the following general formula [4], whereupon substituent groups thereof are an alkyl group having 1–6 carbons, an alkoxy group having 1–6 carbons, an aryl group having 6–18 carbons, an aralkyl group having 7–8 carbons, an aryloxy group having 6–18 carbons, a halogen atom, a substituted or unsubstituted amino group (excluding a diarylamino group), a hydroxyl group, a cyano group, and a nitro group.

[4]

wherein at least one of $R_{16}$ to $R_{20}$ is a diarylamino group represented by —$NR_{23}R_{24}$, whereupon $R_{23}$ and $R_{24}$ each independently represent a substituted or unsubstituted aryl group having 6–18 carbons, and $R_{12}$ to $R_{22}$ excluding the said diarylamino group, —$NR_{23}R_{24}$, each independently represent a hydrogen atom, a halogen atom, a substituted or unsubstituted amino group (excluding a diarylamino group), a hydroxyl group, a cyano group, a nitro group, an alkyl group having 1–6 carbons, an alkoxy group having 1–6 carbons, a substituted or unsubstituted aryl group having 6–18 carbons and a substituted or unsubstituted aryloxy group having 6–18 carbons.

Further, the present invention relates to said organic electroluminescent device comprising an electron-injecting zone between the organic light-emitting zone and the cathode.

The material according to the present invention is used as a material in a light-emitting zone adjacent to an anode to constitute an organic EL device, thereby achieving emission with higher brightness and higher efficiency at low voltage, so the effects of the present invention are outstanding.

DETAILED DESCRIPTION OF THE PREFERRED EMBODIMENTS

The compounds of the present invention are those having the structures represented by the general formula [1] (wherein at least one of $Ar_2$ to $Ar_5$ is represented by the general formula [2]) and the general formula [3] (wherein at least one and at most three of $Ar_7$ to $Ar_{10}$ are represented, by the general formula [4]). In the general formula [1] and [3] above, the compounds used in $Ar_1$ and $Ar_6$ are substituted or unsubstituted arylene groups having 5–42 carbons. Examples of such compounds include naphthylene group, anthrylene group, perylenylene group, 1:2 benzoperylenylene group, 1:2:7:8 dibenzoperylenylene group, 1:2:11:12 dibenzoperylenylene group, terylenylene group, pentacenylene group, bisanthrenylene group, 10,10'-(9,9'-bianthryl) diyl group, 4,4'-(1,1'-binaphthyl)diyl group, 4,10'-(1,9'-naphthylanthryl)diyl group, bivalent groups represented by the general formula [5]:

[5]

wherein $Ar_{11}$ to $Ar_{13}$ each are a naphthylene group or anthrylene group), and divalent groups which is formed by 2 hydrogen atoms removal from aromatic hydrocarbons or condensed polycyclic hydrocarbons such as phenanthrene, pyrene, biphenyl and terphenyl, or heterocyclic compounds or condensed heterocyclic compounds such as carbazole, pyrrole, thiophene, furan, imidazole, pyrazole, isothiazole, isothioxazole, pyridine, pyrazine, pyrimidine, pyridazine, furazane, thianthrene, iosbenzofuran, phenoxazine, indolyzine, indole, isoindole, 1H-indazole, purine, quinoline, isoquinoline, phthalazine, naphthylidine, quinoxaline, quinazoline, cinnoline, pteridine, carbazole, β-carbazoline, phenanethridine, acridine, piperimidine, phenanthroline, phenazine, phenothiazine and phenoxazine, as well as derivates thereof. $Ar_2$ to $Ar_5$ each independently represent substituted or unsubstituted aryl groups having 6–20 carbons, at least one of which is a styrylphenyl group represented by general formula [2] above. $Ar_7$ to $Ar_{10}$ each independently represent substituted or unsubstituted aryl groups having 6–20 carbons, at least one and at most three of which are diarylamino-substituted styrylphenyl groups represented by the general formula [4] above.

Examples of such aryl groups having 6–20 carbons include phenyl group, naphthyl group, anthryl group, phenanthryl group, naphthacenyl group and pyrenyl group.

Examples of the substituted or unsubstituted alkyl groups include methyl group, ethyl group, propyl group, isopropyl group, n-butyl group, s-butyl group, isobutyl group, t-butyl group, n-pentyl group, n-hexyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chioromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, 1,2,3-trinitropropyl group and the like. The substituted or unsubstituted alkoxy group is a group represented by —OY, and Y includes methyl group, ethyl group, propyl group, isopropyl group, n-butyl group, 5-butyl group, isobutyl group, t-butyl group, n-pentyl group, n-hexyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, 1,2,3-trinitropropyl group and the like. Examples of the substituted or unsubstituted aryl groups having 6–18 carbons include e.g. phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl) phenyl group, 3-methyl-2-naphthyl group, 4-methyl-1-naphthyl group, 4-methyl-l-anthryl group, 4'-methylbiphenylyl group, and the like. The substituted or unsubstituted aralkyl groups include benzyl group, 1-phenyl ethyl group, 2-phenyl ethyl group, 1-pyrolyl methyl group, 2-(1-pyrolyl) ethyl group, p-methyl benzyl group, m-methyl benzyl group, o-methyl benzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitorobenzyl group, o-nitrobenzyl group, p-cyanobenzyl group, m-cyanobenzyl group, o-cyanobenyl group, and the like. The substituted or unsubstituted aryloxy groups are represented by —OZ, and Z includes phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl) phenyl group, 3-methyl-2-naphthyl group, 4-methyl-l—naphthyl group, 4-methyl-1-anthryl group, 4'-methylbiphenylyl group, and the like.

The substituted or unsubstituted amino groups are represented by —NX$_1$X$_2$, and X$_1$ and X$_2$ each independently represent hydrogen atom, methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, 1,2,3-trinitropropyl group and the like.

Hereinafter, the examples of compounds (A1) to (A11) of the present invention are shown below, but the present invention is not limited to these examples unless the spirit or scope of the invention is changed.

(A1)

(A2)

(A3)

(A4)

-continued (A5)

(A6)

(A7)

(A8)

(A9)

(A10)

(A11)

The structure of the organic EL device in the present invention is a structure in which one or more organic layers are stacked between the electrodes. In the structure shown in FIG. 1, a light-emitting zone 3 is stacked between an anode 2 and a cathode 5 which are stacked on a substrate 1. Also, in the structure shown in FIG. 2, an anode 2, a light-emitting zone 3, an electron-transporting zone 4 and a cathode 5 are stacked on a substrate 1. The compounds according to the present invention are used in an organic layer forming the light-emitting zone 3. A mixture of the compound and other hole injectable materials, light-emitting materials and electron-transporting materials can be also used.

The electron-transporting material used in the present invention is not particularly limited, and any compounds conventionally used as electron-transporting materials can be used. Examples thereof include oxadiazole derivatives such as 2-(4-biphenyl)-5-(4-t-butylphenyl)-1,3,4-oxadiazole [B01] and bis{2-(4-t-butylphenyl)-1,3,4-oxadiazole}-m-phenylene [B02], as well as triazole derivatives ([B03], [B04] and the like).

wherein Q represents a substituted or unsubstituted hydroxyquinoline derivative and a substituted or unsubstituted benzoquinoline derivative, M represents a metal atom, and n is the valence thereof.

The examples of compounds represented by the general formula [6] include the following compounds [B05] to [B10]:

[B01]

[B02]

[B03]

[B04]

Further, quinolinol-type metal complexes shown in the general formulae [6], [7] and [8] are also mentioned.

[6]

[B05]

wherein Q represents a substituted or unsubstituted hydroxyquinoline derivative and a substituted or unsubstituted benzoquinoline derivative, M represents a metal atom, and n is the valence thereof.

[7]

[B06]

wherein Q represents a substituted or unsubstituted hydroxyquinoline derivative and a substituted or unsubstituted benzoquinoline derivative, L represents a halogen atom, a substituted or unsubstituted alkyl group, a substituted or unsubstituted cycloalkyl group, and a substituted or unsubstituted aryl group that may include a nitrogen atom, M represents a metal atom, and n is the valence thereof.

[8]

The examples of compounds represented by the general formula [7] include the following compounds [B11] to [B16]:

The examples of compounds represented by the general formula [8] include the following compounds [B17] to [B19]:

[B18]

[B22]

[B19]

[B23]

When the light-emitting zone is to be constituted of a plurality of layers, the light-emitting material according to the present invention is used in a layer in contact with the anode, and a light-emitting layer can further be provided between this layer and the cathode. In this case, the compounds shown in formulae (A1) and (A3) to (A10) in the present invention can be combined to form a plurality of layers. Further, the light-emitting zone may be formed from a plurality of light-emitting layers by inserting a light-emitting layer having Compounds [B20] to [B23] mixed with the electron-transporting materials shown in Compounds [B1] to [B19], or by inserting a light-emitting layer consisting of an electron-transporting and light-emitting material such as Compound [B24], into the light-emitting layer in contact with the anode and the cathode.

[B24]

[B20]

[B21]

The anode of the organic thin-film EL device plays the role of injecting holes into the light-emitting zone, and the anode having a work function of 4.5 eV or greater is effective. Specific examples of the anode material used in the present invention include an indium tin oxide (ITO), tin oxide (NESA), gold, silver, platinum and copper. For the purpose of injecting electrons into the electron-transporting layer or light-emitting layer, it is preferable that the cathode material has a smaller work function. Although there is no particular limitation imposed on the cathode material, specific examples include indium, aluminum, magnesium, magnesium-indium alloy, magnesium-aluminum alloy, aluminum-lithium alloy, aluminum-scandium-lithium alloy and magnesium-silver alloy.

Each layer of the organic EL device according to the present invention can be fabricated by any method. Conventionally known methods such as vacuum deposition and spin coating can be employed. The organic thin-film layer which is to be used in the organic EL device of the present invention and contains the compounds of the general formulae [1] and [2] above can be fabricated by a known method such as vacuum deposition, molecular beam epitaxy (MBE) or coating including dipping, spin coating, casting, bar coating or roll coating of a solution of the compounds dissolved in a proper solvent.

There is no particular limitation on the thickness of each organic layer of the organic EL device of the present invention. However, when the thickness of the layer is too thin, defects such as spin holes tend to occur. When the thickness of the layer is too thick, on the other hand, a high-applied voltage is required, which decreases the efficiency. Usually, the organic layers are therefore preferred to have a thickness within a range of several nm to 1 μm.

The present invention will hereinafter be described in detail with reference to examples, but is should however be borne in mind that the present invention is not limited only to the following examples unless the spirit or scope of the invention is changed.

EXAMPLE 1

Figure 1:
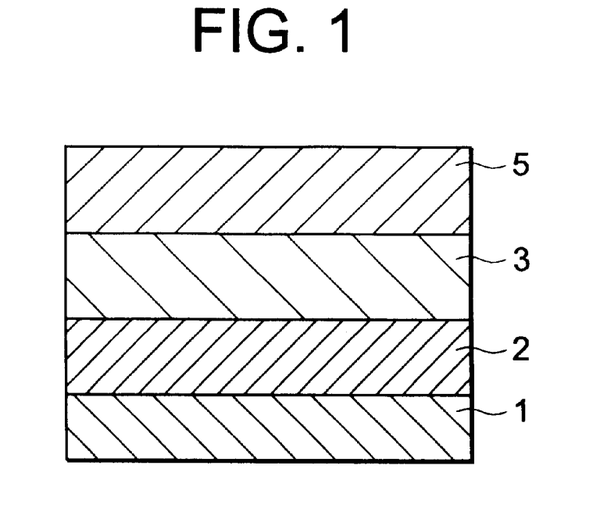
FIG. 1 is a schematic cross-sectional view of a device of the present invention.

The cross-sectional structure of the device used in Example 1 is shown in FIG. 1. Hereinafter, the procedures for fabricating the organic thin-layer EL device used in Example 1 are illustrated. The device is composed of an anode/a light-emitting layer/a cathode. First, ITO was sputtered on a glass substrate to form a film having a sheet resistance of 20 $\Omega/\square$ as the anode. Over the anode, a 40 nm thick light-emitting layer was formed by the vacuum deposition of Compound (A1). Then, a 200 nm thick cathode was formed by the vacuum deposition of a magnesium-silver alloy, whereby the organic EL device was fabricated. When a dc voltage of 6 V was applied to the resulting device, blue light emission of 100 cd/m$^2$ was obtained.

EXAMPLE 2

In a similar manner to Example 1 except for the use of Compound (A2) instead of Compound (A1), an organic EL device was fabricated. When a dc voltage of 6 V was applied to the resulting device, blue light emission of 150 cd/m$^2$ was obtained.

EXAMPLE 3

First, ITO was sputtered on a glass substrate to form a film having a sheet resistance of 20 $\Omega/\square$ as the anode. Over the anode, a 40 nm thick light-emitting layer was formed by the spin coating of a solution of Compound (A1) in chloroform. Then, a 200 nm thick cathode was formed by the vacuum deposition of a magnesium-silver alloy, whereby the organic EL device was fabricated. When a dc voltage of 6 V was applied to the resulting device, emission of 120 cd/m$^2$ was obtained.

EXAMPLE 4

Figure 2:
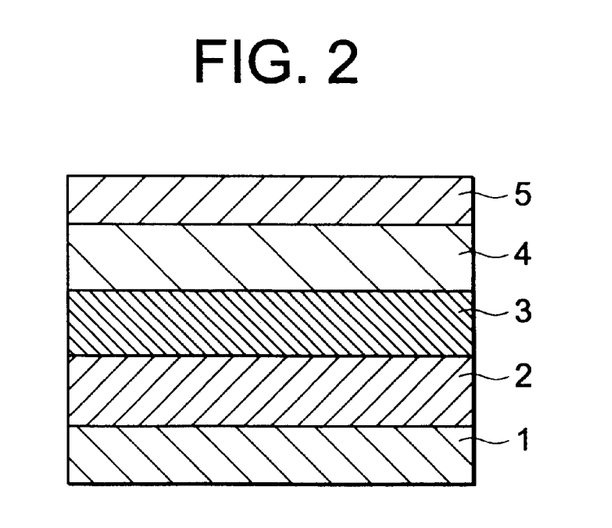
FIG. 2 is a schematic cross-sectional view of another device of the present invention.

The cross-sectional structure of the device used in Example 4 is shown in FIG. 2. The device is composed of an anode/a light-emitting layer/an electron-transporting layer/a cathode. First, ITO was sputtered on a glass substrate to form a film having a sheet resistance of 20 $\Omega/\square$ as the anode. Over the anode, a 40 nm thick light-emitting layer was formed by the vacuum deposition of Compound (A1). Then, a 20 nm thick electron-transporting layer was formed by the vacuum deposition of 2-(4-biphenylyl)-5-(4-t-butylphenyl)-1,3,4-oxadiazole [B01]. Then, a 200 nm thick cathode was formed by the vacuum deposition of a magnesium-silver alloy, whereby the organic EL device was fabricated. When a dc voltage of 7 V was applied to the resulting device, blue light emission of 1500 cd/m$^2$ was obtained.

EXAMPLE 5

In a similar manner to Example 4 except for the use of Compound (A2) instead of Compound (A1) and the use of bis{2-(4-t-butylphenyl)-1,3,4-oxadiazole}-m-phenylene [B02] instead of Compound [B01], an organic EL device was fabricated. When a dc voltage of 7 V was applied to the resulting device, blue light emission of 2000 cd/m$^2$ was obtained.

EXAMPLE 6

In a similar manner to Example 4 except for the use of Compound (A3) instead of Compound (A1) and the use of [B03] instead of Compound [B01], an organic EL device was fabricated. When a dc voltage of 7 V was applied to the resulting device, blue light emission of 2800 cd/m$^2$ was obtained. The maximum efficiency of this device was 2.01 m/W, or 0.02 W/W in terms of power ratio.

EXAMPLE 7

In a similar manner to Example 4 except for the use of [B11] instead of Compound [B01], an organic EL device was fabricated. When a dc voltage of 7 V was applied to the resulting device, blue light emission of 3000 cd/m$^2$ was obtained. The maximum efficiency of this device was 2.51 m/W, or 0.025 W/W in terms of power ratio.

EXAMPLES 8 TO 15

In a similar manner to Example 4 except that the light-emitting material and electron-transporting material used were selected as shown in Table 1, an organic EL device was fabricated.

TABLE 1

| Example | Light-emitting material | Electron-transporting material | Emission color | Brightness at 7 V (cd/m$^2$) | Maximum efficiency (lm/m) | Maximum efficiency (w/w) |
|---|---|---|---|---|---|---|
| 8 | (A3) | [B14] | blue | 3000 | 2.2 | 0.023 |
| 9 | (A4) | [B14] | blue | 2800 | 2.2 | 0.023 |
| 10 | (A5) | [B14] | blue | 4000 | 2.5 | 0.025 |
| 11 | (A6) | [B03] | blue | 2400 | 1.9 | 0.018 |
| 12 | (A7) | [B14] | blue | 3800 | 2.5 | 0.025 |
| 13 | (A9) | [B05] | blue | 2900 | 2.0 | 0.018 |
| 14 | (A10) | [B14] | blue | 3300 | 2.8 | 0.030 |
| 15 | (A11) | [B14] | blue | 3000 | 2.5 | 0.025 |

EXAMPLE 16

In a similar manner to Example 4 except that the light-emitting layer was divided into 2 layers; Compound (Al) was used in the first light-emitting layer in contact with the anode; Compound (A9) was used in the second light-emitting layer inserted into between the first light-emitting layer and the electron-transporting layer; the respective layers were formed to have 20 nm and 40 nm respectively; and Compound [B14] was used in the electron-transporting layer, an organic EL device was fabricated. When a dc voltage of 7 V was applied to the resulting device, blue light emission of 3800 cd/m$^2$ was obtained. The maximum efficiency of this device was 2.71 m/W, or 0.028 W/W in terms of power ratio.

EXAMPLE 17

In a similar manner to Example 16 except that Compound (A7) was used in the first light-emitting layer and Compound [B24] was used in the second light-emitting layer, a device was fabricated. When a dc voltage of 7 V was applied to the resulting device, blue light emission of 3000 cd/m$^2$ was obtained. The maximum efficiency of this device was 1.91 m/W, or 0.020 W/W in terms of power ratio.

EXAMPLE 18

In a similar manner to Example 16 except that Compound (A9) was used in the first light-emitting layer, and Compound [B05] containing Compound [B21] in an amount of 2% in terms of deposition velocity ratio was used in the second light-emitting layer, a device was fabricated. When a dc voltage of 7 V was applied to the resulting device, bluish white light emission of 3800 cd/m² was obtained. The maximum efficiency of this device was 2.91 m/W, or 0.020 W/W in terms of power ratio.

What is claimed is:

1. An organic electroluminescent device comprising at least an anode, an organic light-emitting zone which consists of one or more than one organic thin-film layers and a cathode as elements, wherein said organic light-emitting zone is adjacent to the anode, and a layer contacting with the anode in the light-emitting zone contains, either singly or as a mixture, a compound represented by the following formula [1]:

[1]

wherein $Ar_1$ represents a bivalent group consisting of an unsubstituted naphthalene skeleton, $Ar_2$ represents a styrylphenyl group shown by general formula [2] below, $Ar_3$ and $Ar_4$ each represent a substituted or unsubstituted aryl group whose carbon number is 6 through 20 that does not have a styryl substitution group, and $Ar_5$ represents a substituted or unsubstituted aryl group whose carbon number is 6 through 20, wherein substituent groups of $Ar_3$, $Ar_4$ and $Ar_5$ are an alkyl group having 1–6 carbons, an alkoxy group having 1–6 carbons, an aryl group having 6–18 carbons, an aralkyl group having 7–8 carbons, an aryloxy group having 6–18 carbons, a halogen atom, a substituted or unsubstituted amino group (excluding a diarylamino group), a hydroxyl group, a cyano group, and a nitro group, and wherein the $Ar_5$ substituent groups also include a styryl group;

[2]

wherein $R_1$ to $R_{11}$ each independently represent a hydrogen atom, a halogen atom, a substituted or unsubstituted amino group (excluding a diarylamino group), a hydroxyl group, a cyano group, a nitro group, an alkyl group having 1–6 carbons, an alkoxy group having 1–6 carbons, a substituted or unsubstituted aryl group having carbons and a substituted or unsubstituted aryloxy group having 6–18 carbons.

2. An organic electroluminescent device according to claim 1, which comprises an electron-injecting zone between the organic light-emitting zone and the cathode.

3. An organic electroluminescent device according to claim 1, wherein said organic electroluminescent device has a brightness of 100 cd/m² or more at an applied voltage of 10 V or less.

* * * * *